(12) United States Patent
Liao (10) Patent No.: US 11,490,551 B2
(45) Date of Patent: Nov. 1, 2022

(54) CHIP REMOVING DEVICE AND CHIP REMOVING METHOD

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 567 days.

(21) Appl. No.: 16/579,638

(22) Filed: Sep. 23, 2019

(65) Prior Publication Data

US 2020/0367395 A1 Nov. 19, 2020

(30) Foreign Application Priority Data

May 16, 2019 (TW) .................................. 108116829

(51) Int. Cl.
| | |
|---|---|
| *H05K 13/04* | (2006.01) |
| *H01L 23/00* | (2006.01) |
| *H01L 33/32* | (2010.01) |
| *B23K 26/57* | (2014.01) |
| *B23K 26/14* | (2014.01) |

(52) U.S. Cl.
CPC ..... *H05K 13/0486* (2013.01); *B23K 26/1464* (2013.01); *B23K 26/57* (2015.10); *H01L 24/98* (2013.01); *H01L 33/32* (2013.01); *H05K 13/0409* (2018.08)

(58) Field of Classification Search
CPC ....... H01L 24/799; H01L 24/98; H01L 33/32; H05K 13/0486; H05K 13/0409; B23K 1/018; B23K 26/57; B23K 26/1464
USPC ......................................................... 228/264
See application file for complete search history.

(56) References Cited

U.S. PATENT DOCUMENTS

| | | | |
|---|---|---|---|
| 2006/0037188 A1* | 2/2006 | Fukaya .................. | B23K 1/018 29/603.03 |
| 2013/0008020 A1* | 1/2013 | Park ...................... | B23K 1/0056 29/762 |

FOREIGN PATENT DOCUMENTS

CN 102861959 B 6/2016

* cited by examiner

*Primary Examiner* — Brook Kebede (57) ABSTRACT

A chip removing device and a chip removing method are provided. The chip removing device includes: a carrier substrate, a laser generation module, and a blowing module. The carrier substrate carries at least one substrate, and a plurality of chips disposed on the substrate. The laser generation module corresponds to the carrier substrate and is used to apply a laser beam to the chip to reduce the bonding force between the chip and the substrate. The blowing module is disposed above the carrier substrate and close to the substrate for applying a gas to the chip to blow the chip away from the substrate.

3 Claims, 10 Drawing Sheets

CHIP REMOVING DEVICE AND CHIP REMOVING METHOD

CROSS-REFERENCE TO RELATED PATENT APPLICATION

This application claims the benefit of priority to Taiwan Patent Application No. 108116829 filed on May 16, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a removing device and a removing method, and more particularly to a chip removing device and a chip removing method.

BACKGROUND OF THE DISCLOSURE

Light-emitting diodes (LEDs) are widely used nowadays for their excellent light quality and high luminous efficiency. Generally, in order to improve color performance, a conventional display device using a light-emitting diode as a light-emitting element adopts a combination of red, green, and blue light-emitting diode chips to form a full color light-emitting diode display device. The full-color light-emitting diode display device can respectively emit three colors of red, green and blue light through three kinds of red, green and blue light-emitting diode chips, so that a full-color light is formed to display relevant information after mixing of light. When the light-emitting diode chip on the circuit substrate is damaged, the damaged light-emitting diode chip is generally removed from the circuit substrate through a tool such as a nozzle, a knife or a jig.

However, with the evolution of technology, electronic devices have become smaller in size, and electronic components inside the electronic devices have become smaller, such as miniaturized IC chips or LED chips. Therefore, when a miniaturized chip on the circuit substrate is damaged, since a size of the nozzle, the knife or the jig is too large, the miniaturized chip cannot be removed smoothly, which can cause inconveniences during replacement with a new chip.

SUMMARY OF THE DISCLOSURE

In response to the above-referenced technical inadequacies, the present disclosure provides a chip removing device and a chip removing method.

In one aspect, the present disclosure provides a chip removing device, including: a carrier substrate, a laser generation module, and a blowing module. The carrier substrate carries at least one substrate, and a plurality chips are disposed on the substrate. The laser generation module corresponds to the carrier substrate for applying a laser beam to the chip to reduce the bonding force between the chip and the substrate. The blowing module is disposed above the carrier substrate and close to the substrate for applying a gas to the chip to blow the chip away from the substrate.

In one aspect, the present disclosure provides a chip removing method, including: providing a carrier substrate carrying at least one substrate, wherein a plurality of chips are disposed on the substrate by a solder; applying a laser beam to the chips by using a laser generation module to reduce the bonding force between the chips and the substrate; and applying a gas to the chip by using a blowing module to blow the chips away from the substrate.

One of the beneficial effects of the present disclosure is that the chip removing device provided by the present disclosure has the technical features of "the chip removing device including: a carrier substrate, a laser generation module, and a blowing module," "the carrier substrate carrying at least one substrate," "the laser generation module corresponding to the carrier substrate to reduce the bonding force between the chip and the substrate" and "the blowing module disposed above the carrier substrate and close to the substrate for applying a gas to the chip to blow the chip away from the substrate" so as to improve the convenience of chip removal.

Another one of the beneficial effects of the present disclosure is that the chip removing method provided by the present disclosure has the technical features of "providing a carrier substrate carrying at least one substrate, wherein a plurality of chips are disposed on the substrate by a solder," "applying a laser beam to the chip by using a laser generation module to reduce the bonding force between the chip and the substrate" and "applying a gas to the chip by using a blowing module to blow the chip away from the substrate" so as to improve the convenience of chip removal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
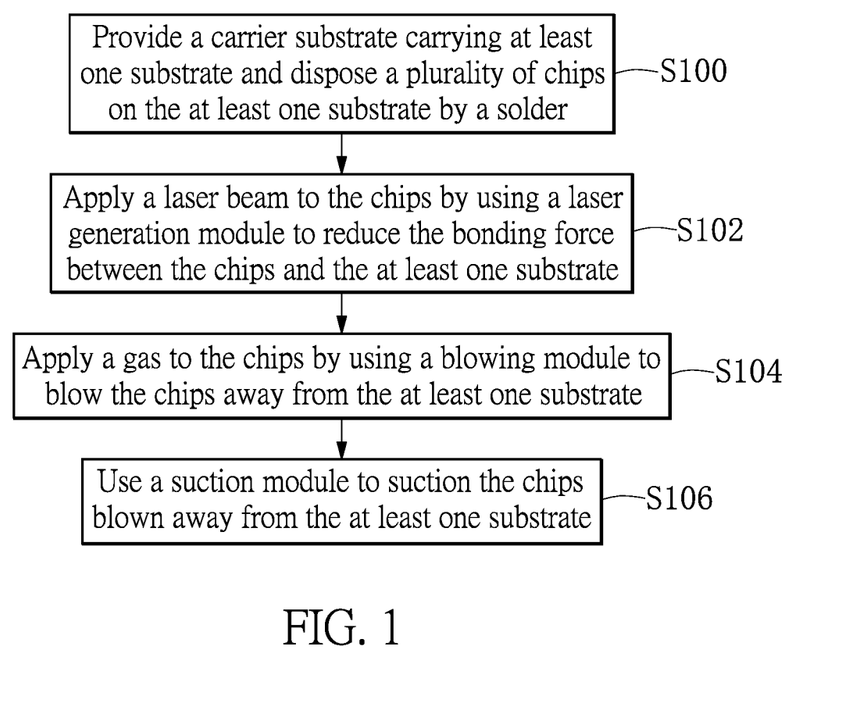
FIG. 1 is a flowchart of a chip removing method according to a first embodiment of the present disclosure.
Figure 2:
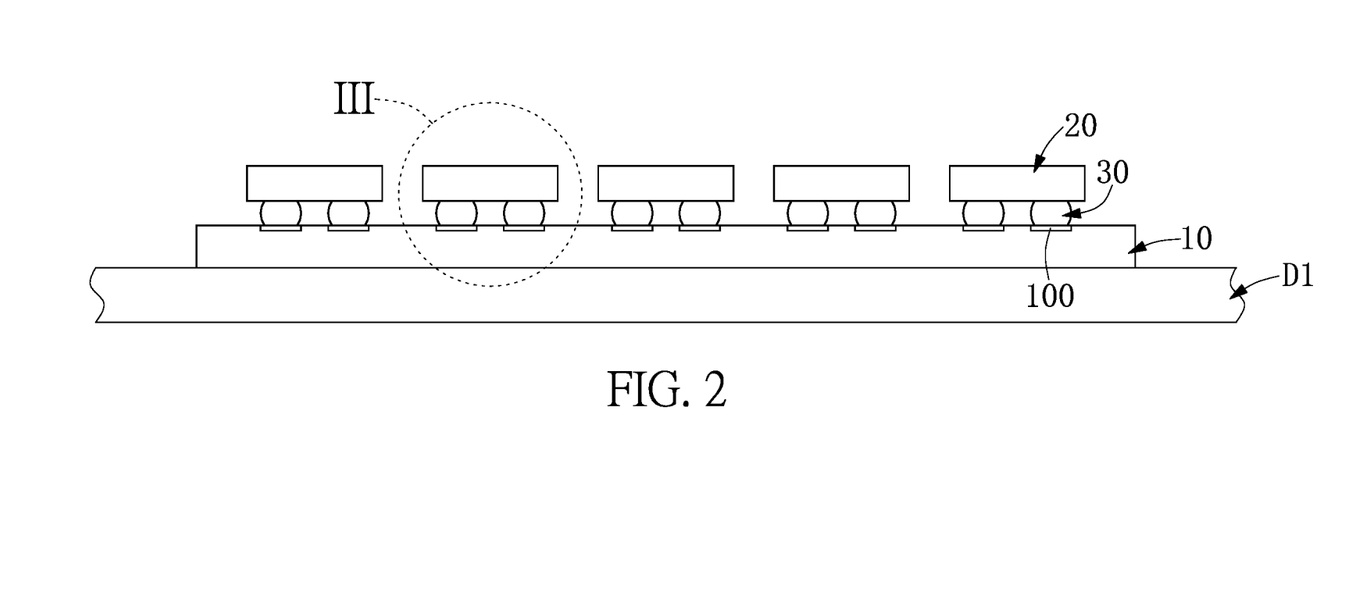
FIG. 2 is a schematic view of a step S100 of the chip removing method according to the first embodiment of the present disclosure.

Referring to FIG. 1 to FIG. 7, a first embodiment of the present disclosure provides chip removing method includes the following steps:

Firstly, as shown in FIG. 1 and FIG. 2, a carrier substrate D1 carrying at least one substrate 10 is provided, and a plurality of chips 20 are disposed on the substrate 10 through a solder 30 (step S100). For example, in the step S100 of the present disclosure, the at least one substrate 10 can be carried by a carrier substrate D1, and the substrate 10 can be a single substrate or a composite substrate. The substrate 10 further includes a plurality of solder pads 100, each of the solder pads 100 may be provided with at least one solder 30, and the solder 30 may be a solder ball or other types of conductive materials. Moreover, the carrier substrate D1 can be a carrier device having a displacement function. The plurality of chips 20 are disposed on the substrate 10, and each of the chips 20 is disposed on at least two of the solders 30. However, the present disclosure is not limited thereto.

Figure 3:
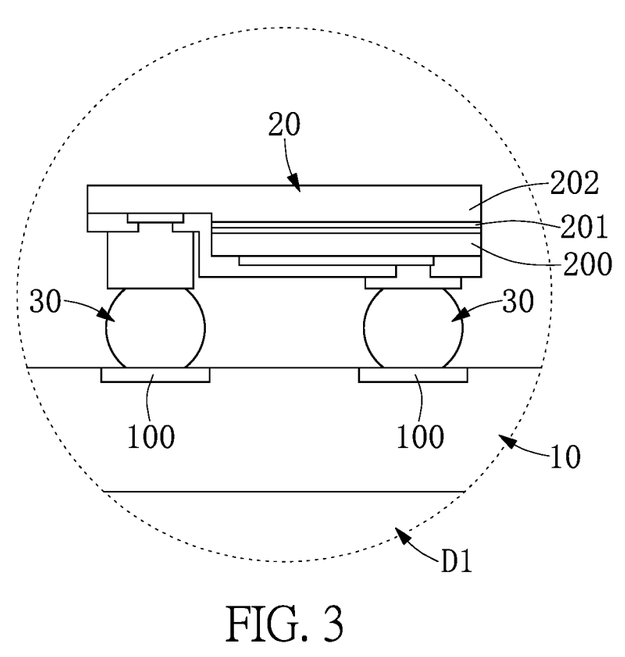
FIG. 3 is an enlarged schematic view of a portion III of FIG. 2.

Further, as shown in FIG. 2 and FIG. 3, the chip 20 of the present disclosure may be a light-emitting diode chip having a length less than 100 μm, and may further be a micro-semiconductor light-emitting element (Micro LED). The chip 20 of the present disclosure includes an n-type conductive layer 200, a light-emitting layer 201 through which a laser beam passes, and a p-type conductive layer 202 that are disposed in a stacked arrangement. The n-type conductive layer 200 is an n-type gallium nitride material layer or an n-type gallium arsenide material layer, the light-emitting layer 201 is a multi-quantum well structure layer, and the p-type conductive layer 202 is a p-type gallium nitride material layer or a p-type gallium arsenide material layer. However, the above-mentioned examples illustrate only one of the embodiments, and the present disclosure is not limited thereto.

Figure 4:
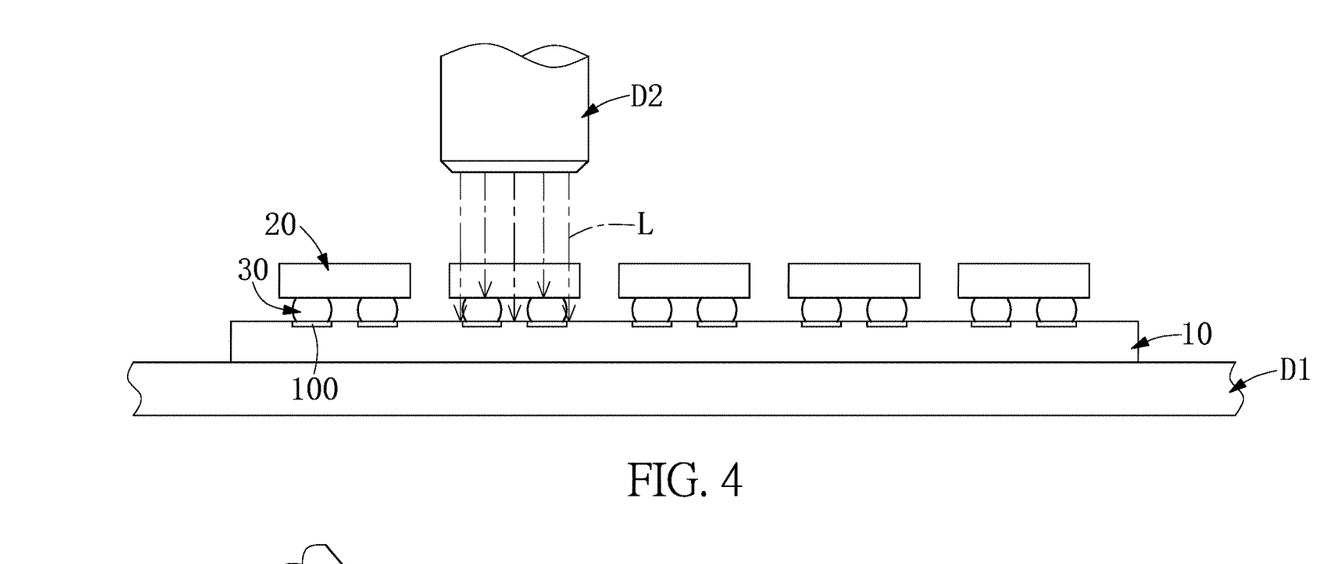
FIG. 4 is a schematic view of a step S102 of the chip removing method according to the first embodiment of the present disclosure.

Next, with reference to FIG. 1 and FIG. 4, the present disclosure applies a laser beam L to the chip 20 by a laser generation module D2 after step S100 to reduce the bonding force between the chip 20 and the substrate 10 (step S102). For example, as shown in FIG. 1 to FIG. 4, after step S100, the present disclosure generates the laser beam L through the laser generation module D2 to be projected to the damaged chip 20. When the laser beam L is projected to the chip 20, the light passes through the n-type conductive layer 200, the light-emitting layer 201, and the p-type conductive layer 202 of the chip 20, and then projects to at least two solders 30 on the substrate 10. Further, the laser generation module D2 may be disposed above, on the side or below the carrier substrate D1, preferably above the carrier substrate D1, but the present disclosure is not limited thereto. By adjusting the intensity of the laser beam L generated by the laser generation module D2 of the present disclosure, the laser beam L generated by the laser generation module D2 can only pass through the chip 20 to be projected on the solder 30 without passing through the substrate 10.

Figure 5:
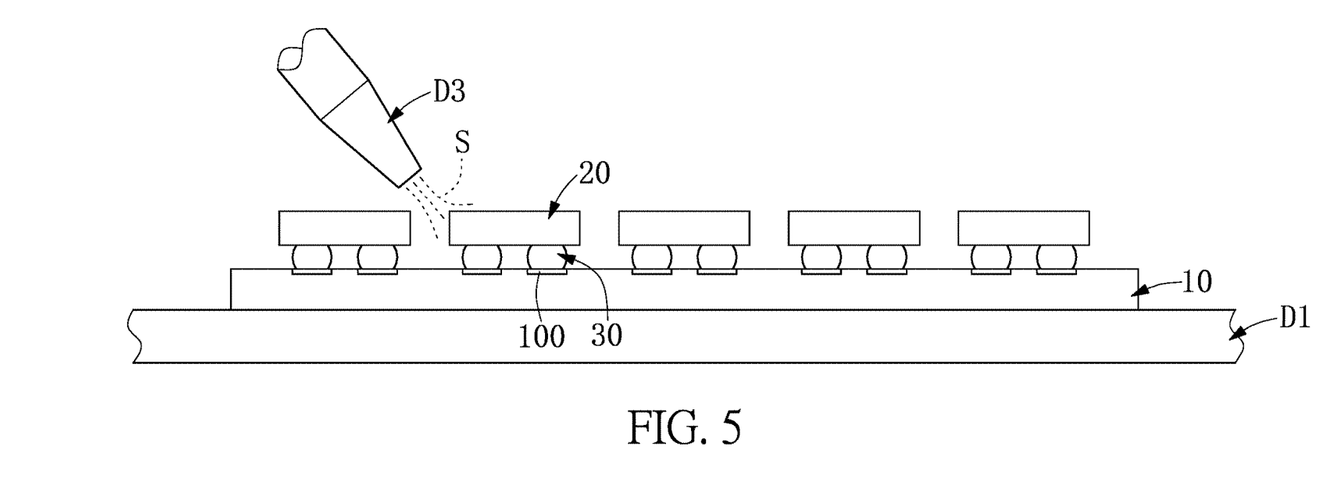
FIG. 5 is a schematic view of a step S104 of the chip removing method in operation according to the first embodiment of the present disclosure.
Figure 6:
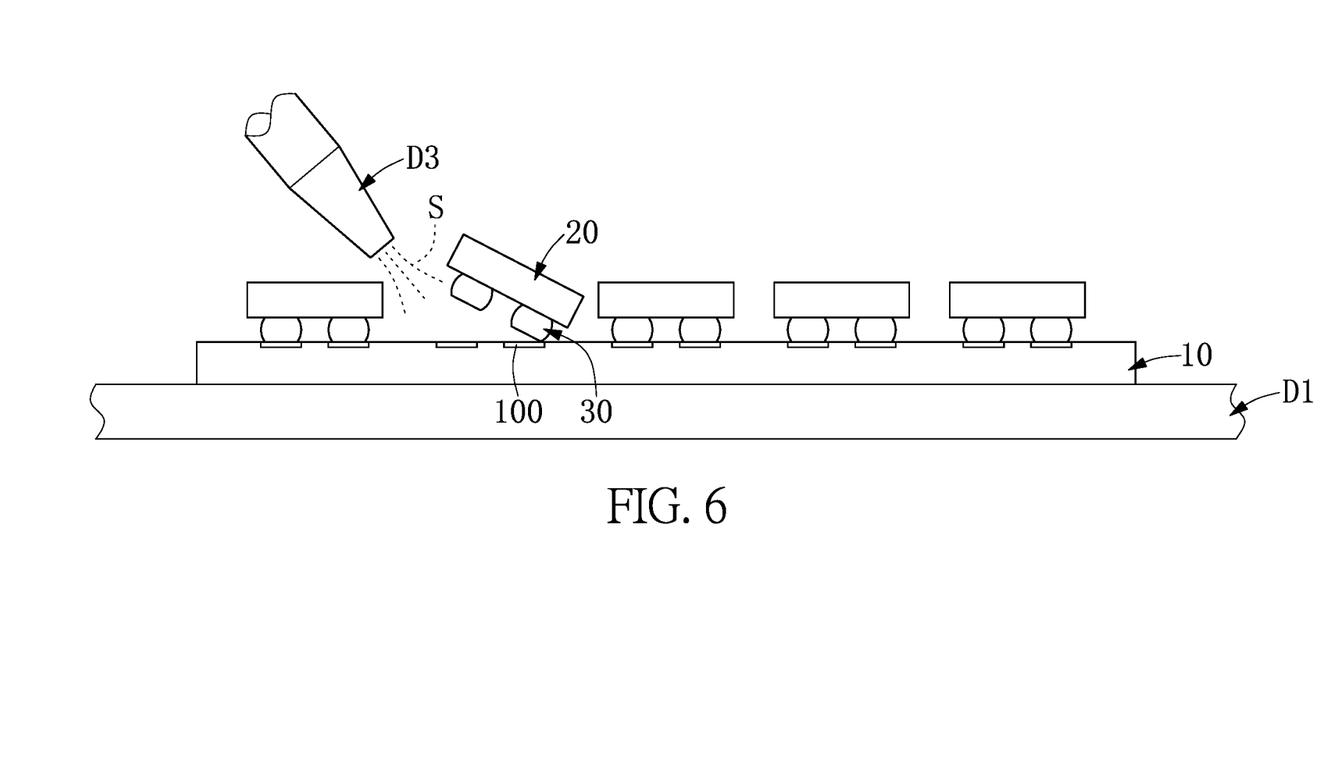
FIG. 6 is a schematic view of a step S104 of the chip removing method in action according to the first embodiment of the present disclosure.
Figure 7:
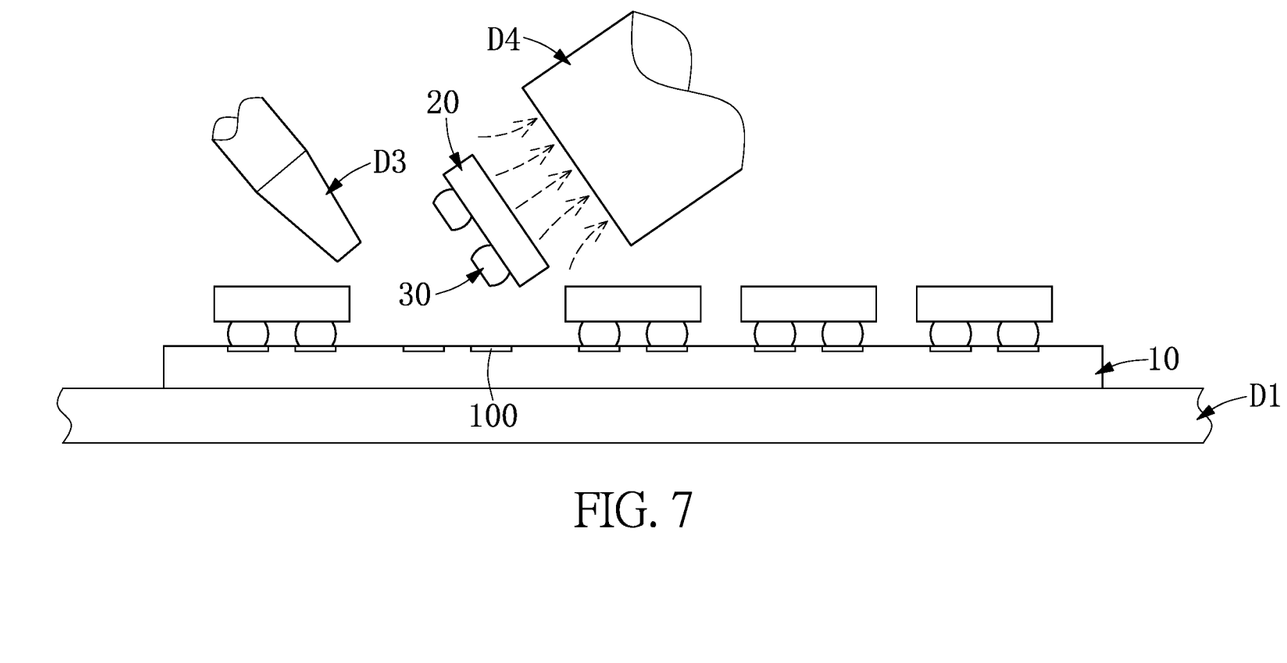
FIG. 7 is a schematic view of a step S106 of the chip removing method according to the first embodiment of the present disclosure.

Next, as shown in FIG. 1 and FIG. 5 and FIG. 6, a gas S is applied to the chip 20 by a blowing module D3 so that the chip 20 is blown away from the substrate 10 (step S104). For example, as shown in FIG. 1 and FIG. 4 to FIG. 6, after the step S102, softening occurs after the solder 30 disposed between the chip 20 and the substrate 10 is irradiated by the laser beam L. Therefore, the gas S is applied to the chip 20 through the blowing module D3 so that the chip 20 is blown away from the substrate 10. The blowing module D3 can be an air blowing device, and a gas output pressure can be determined by an operator or a manufacturer. In addition, when the chip 20 is blown away from the substrate 10, the solder 30 will adhere to the chip 20 blown away from the substrate 10, and will not remain on the solder pad 100 of the substrate 10. However, the above-mentioned examples illustrate only one of the embodiments, and the present disclosure is not limited thereto.

Therefore, the chip removing method provided by the present disclosure can not only improve the convenience of removing the chip 20, but also can prevent the solder 30 from remaining on the solder pad 100 of the substrate 10, thus, a welding accuracy when replacing the chip 20 will not be affected.

It should be noted that, referring to FIG. 1 to FIG. 6, the present disclosure further provides a chip removing device including: the carrier substrate D1, the laser generation module D2, and the blowing module D3. The carrier substrate D1 carries at least one substrate 10, and the plurality of chips 20 are disposed on the substrate 10. The laser generation module D2 corresponds to the carrier substrate D1 for applying the laser beam L to the chip 20 to reduce the bonding force between the chip 20 and the substrate 10. The blowing module D3 is disposed above the carrier substrate D1 and close to the substrate 10 for applying a gas S to the chip 20 so that the chip 20 is blown away from the substrate 10.

It should be noted that, referring to FIG. 1 to FIG. 7, the present disclosure further provides a chip removing method of the present disclosure further includes: suctioning the chip 20 blown away from the substrate 10 by using a suction module D4 (step S106). For example, as shown in FIG. 1 and FIG. 4 to FIG. 7, after step S104, the suction module D4 of the present disclosure can further retrieve the chip 20 that is blown away from the substrate 10. The suction module D4 can be a vacuuming device or any device with a suction function, and a suction value can be determined by the operator or the manufacturer. However, the above-mentioned examples illustrate only one of the embodiments, and the present disclosure is not limited thereto.

According to the above, referring to FIG. 1 to FIG. 7, the chip removing device provided by the present disclosure may further include: the suction module D4 disposed above the carrier substrate D1 to suction the chip 20 blown away from the substrate 10.

Figure 8:
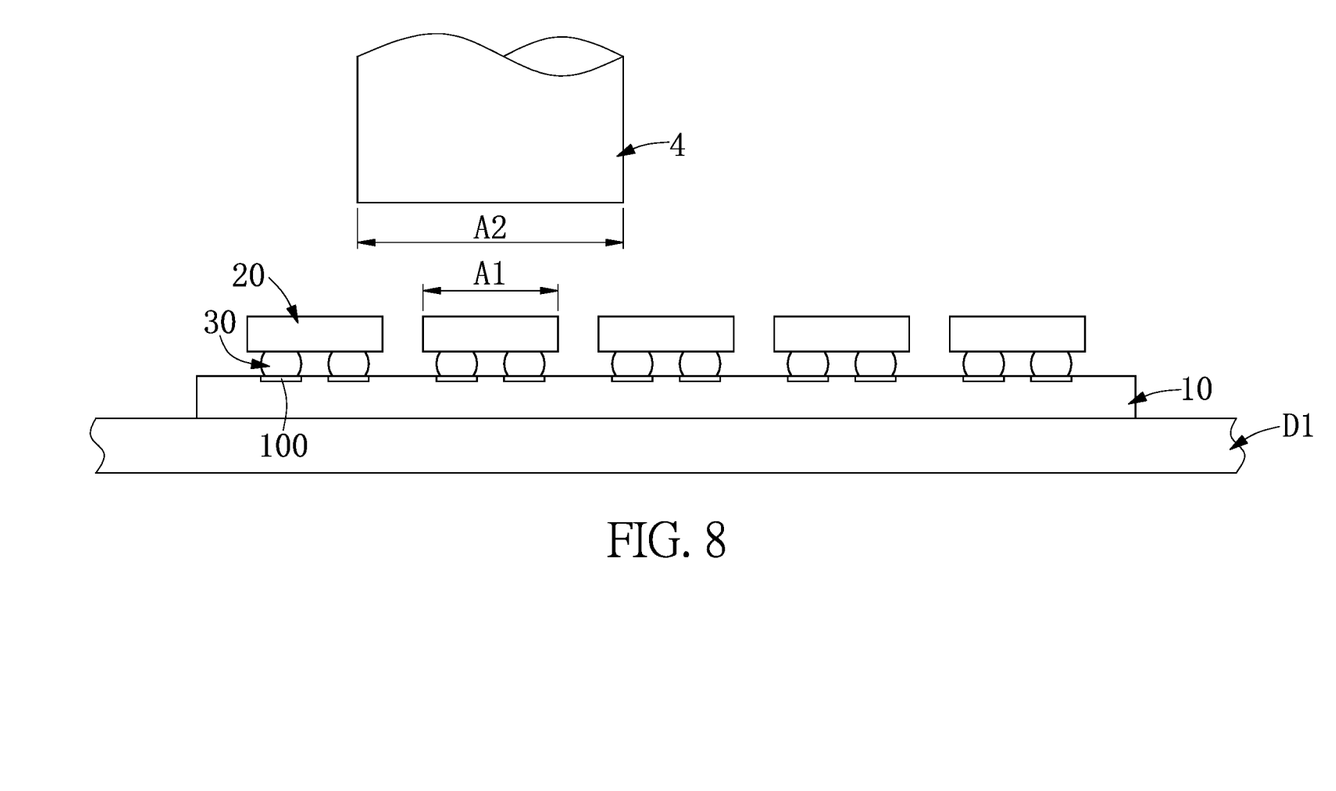
FIG. 8 is a schematic view of the chip removing device using a conventional nozzle in operation according to the first embodiment of the present disclosure.

Furthermore, a top area A1 of the chip 20 is smaller than an opening area A2 of a nozzle 4, and the nozzle 4 will simultaneously contact at least two chips 20, so that the nozzle 4 cannot suction only one chip 20 at a time. For example, as shown in FIG. 2 and FIG. 8, in the present disclosure, the top area A1 of the chip 20 is smaller than the opening area A2 of the nozzle 4, and the opening area A2 is 1.5 to 2 times of the top area A1. The nozzle 4 can be a conventional suction device. Therefore, in the related art, if one of the damaged chips 20 is suctioned by the nozzle 4, the adjacent undamaged chip 20 is easily suctioned together, or the undamaged chip 20 is easy to be partially detached from the substrate 10.

Figure 9:
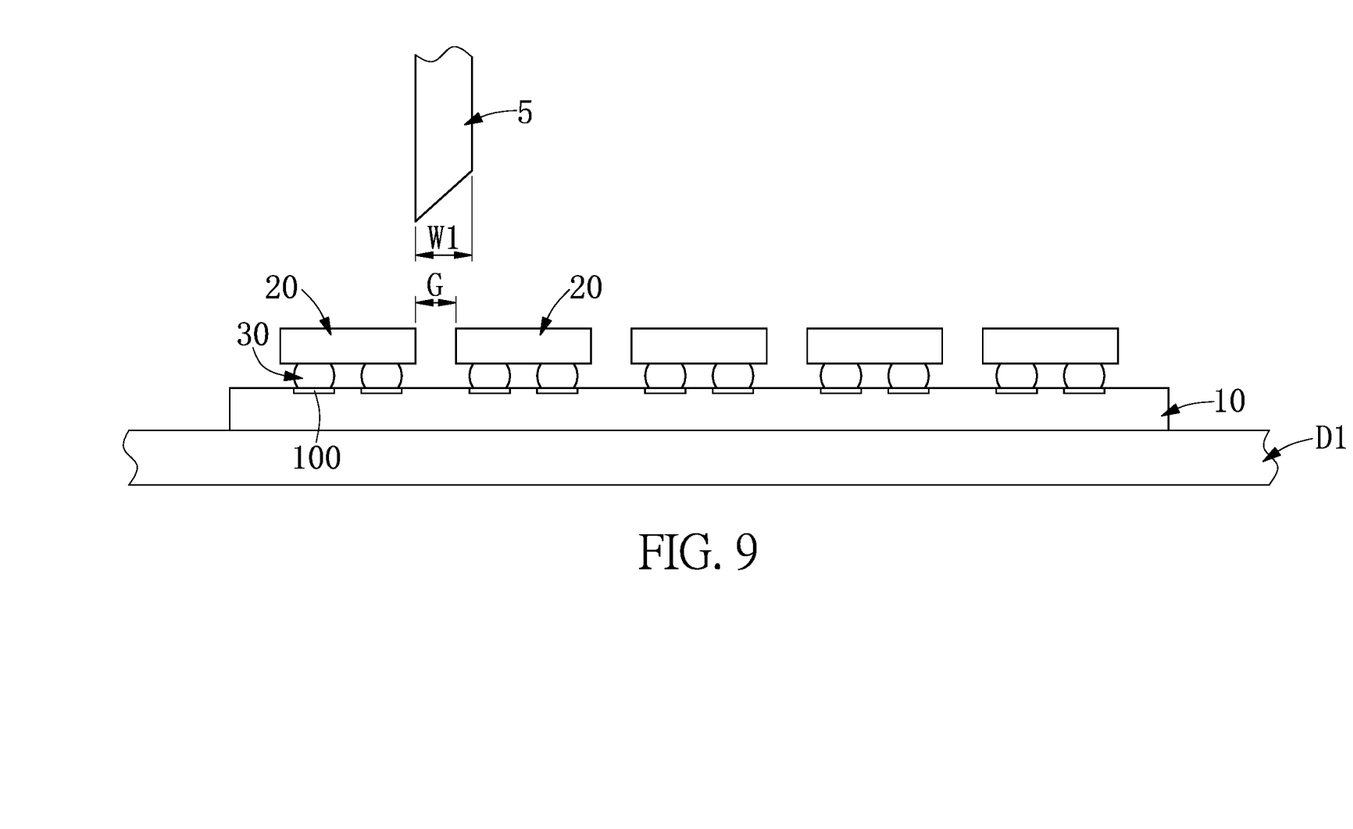
FIG. 9 is a schematic view of the chip removing device using a chip picking knife in operation according to the first embodiment of the present disclosure.

Furthermore, a gap G between the two chips 20 is smaller than a width W1 that can be inserted by a chip picking knife 5, so that the chip picking knife 5 cannot inserted into the gap G between the two chips 20, and the gap G can be 50 μm, but the present disclosure is not limited thereto. For example, as shown in FIG. 2 and FIG. 9, in the present disclosure, the gap G between the plurality of chips 20 on the substrate 10 is smaller than the width W1 into which the chip picking knife 5 can be inserted, and the chip picking knife 5 can be a conventional picking tool. Therefore, in the related art, if one of the damaged chips 20 is shoveled by the chip picking knife 5, the adjacent undamaged chip 20 is easily damaged.

Furthermore, the gap G between the two chips 20 is smaller than a width W2 that can be inserted by a chip gripper 6, so that the chip gripper 6 cannot be inserted into the gap G between the two chips 20, and the gap G can be 50 μm, but the present disclosure is not limited thereto. For example, as shown in FIG. 2 and FIG. 9, in the present disclosure, the gap G between the plurality of chips 20 on the substrate 10 is smaller than the width W2 into which the chip gripper 6 can be inserted, and the chip gripper 6 can be a conventional gripper tool. Therefore, in the related art, if one of the damaged chips 20 is clamped by the chip gripper 6, the adjacent undamaged chip 20 is easily damaged.

However, the above-mentioned examples illustrate only one of the embodiments, and the present disclosure is not limited thereto.

Second Embodiment

Figure 10:
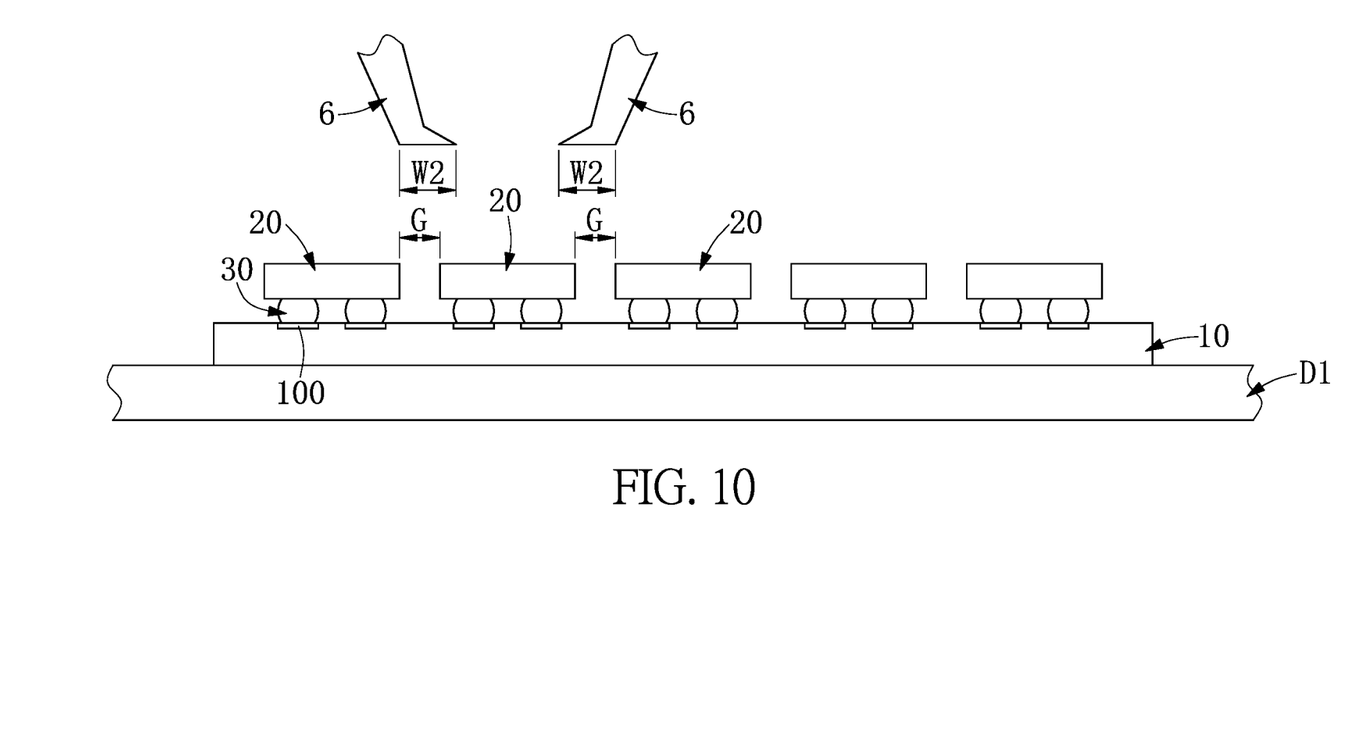
FIG. 10 is a schematic view of the chip removing device using a chip gripper in operation according to the first embodiment of the present disclosure.
Figure 11:
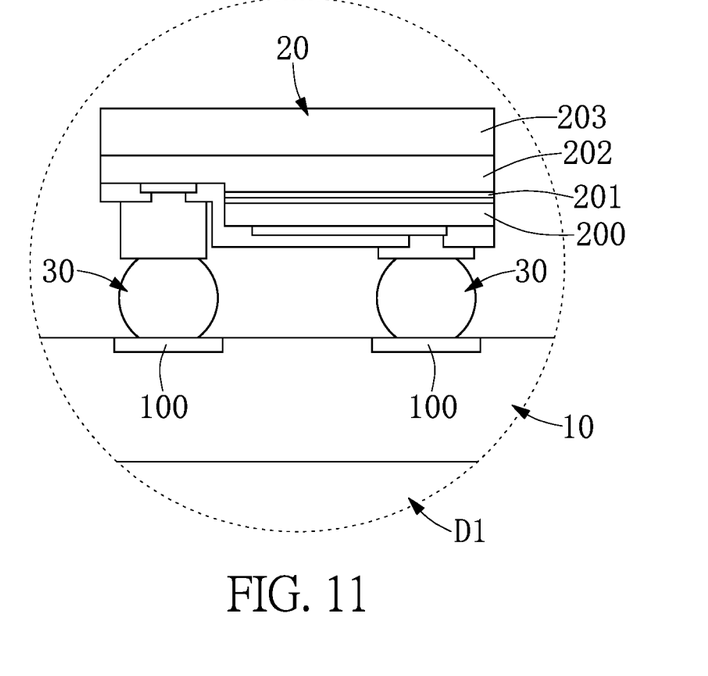
FIG. 11 is a structural schematic view of a chip removing device according to a second embodiment of the present disclosure.

Referring to FIG. 10 together with FIG. 1 to FIG. 9, a second embodiment of the present disclosure provides a chip removing device that is slightly similar to the chip removing device of the first embodiment. Therefore, similar steps will not be repeated herein. Further, with reference to FIG. 10, and compared FIG. 10 with FIG. 3, the difference between the second embodiment of the present disclosure and the first embodiment is that, the chip 20 of the present embodiment may be a light-emitting diode chip having a length less than 100 μm, and may further be a sub-millimeter light-emitting diode (Mini LED). The chip 20 includes a base layer 203, the n-type conductive layer 200, the light-emitting layer 201 through which a laser beam passes, and the p-type conductive layer 202 that are disposed in a stacked arrangement. The base layer 203 is a sapphire material layer, the n-type conductive layer 200 may be an n-type gallium nitride material layer or an n-type gallium arsenide material layer, the light-emitting layer 201 is a multi-quantum well structure layer, and the p-type conductive layer 202 may be a p-type gallium nitride material layer or a p-type gallium arsenide material layer, but the present disclosure is not limited thereto. The base layer 203 may also be a quartz base layer, a glass base layer, a tantalum base layer, or a base layer of any material. However, the above-mentioned examples illustrate only one of the embodiments, and the present disclosure is not limited thereto.

For example, when the laser beam L generated by a laser generation module D2 is projected to the chip 20, the laser beam L passes through the base layer 203, the n-type conductive layer 200, the light-emitting layer 201, and the p-type conductive layer 202, and at least two solders 30 are projected on the substrate 10, thereby softening the solder 30.

Therefore, the chip removing device provided by the present disclosure has the technical features of "the chip removing device including: a carrier substrate D1, a laser generation module D2, and a blowing module D3," "the carrier substrate D1 carrying at least one substrate 20," "the laser generation module D2 corresponding to the carrier substrate 10 to reduce the bonding force between the chip 20 and the substrate 20" and "blowing module D2 disposed above the carrier substrate D1 and close to the substrate 10 for applying a gas S to the chip 20 so that the chip 20 is blown away from the substrate 10" so as to improve the convenience of removing chips.

Therefore, the chip removing method provided by the present disclosure has the technical features of "providing a carrier substrate D1 carrying at least one substrate 10, and a plurality of chips 20 are disposed on the substrate by a solder 30," "applying a laser beam L to the chip 20 using a laser generation module D2 to reduce the bonding force between the chip 20 and the substrate 10" and "applying a gas S to the chip 20 using a blowing module D3 so that the chip 20 is blown away from the substrate 10" so as to improve the convenience of removing chips. By the above technical features, one of the chips 20 of the chip removing device and chip removing method provided by the present disclosure can be removed without affecting the surrounding chips 20. Moreover, the chip removing device and chip removing method provided by the present also has the technical feature of preventing the solder 30 from remaining on the solder pad 100 of the substrate 10, and avoid affecting the soldering precision when the chip 20 is subsequently replaced.

Furthermore, with the evolution of technology, the size of electronic devices has become smaller, and the electronic components inside electronic devices have also become smaller. Therefore, existing tools currently used to remove chips cannot be applied to miniaturized electronic components.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip removing method, comprising:
   providing a carrier substrate carrying at least one substrate, wherein a plurality of chips are disposed on the at least one substrate by a solder;
   applying a laser beam to a damaged chip of the plurality of chips by using a laser generation module to reduce the bonding force between the damaged chip and the at least one substrate; and
   applying a gas to blow the damaged chip away from the at least one substrate.

2. The chip removing method according to claim 1, further comprising: using a suction module to suck the damaged chip blown away from the at least one substrate.

3. The chip removing method according to claim 1, wherein the solder is attached to the damaged chip that is blown away from the at least one substrate and does not remain on a solder pad of the at least one substrate.

* * * * *